US011063563B1

(12) United States Patent
Jackson et al.

(10) Patent No.: US 11,063,563 B1
(45) Date of Patent: Jul. 13, 2021

(54) SYSTEMS AND METHODS FOR SPECIFIC EMITTER IDENTIFICATION

(71) Applicant: Raytheon Company, Waltham, MA (US)

(72) Inventors: Edward M. Jackson, El Segundo, CA (US); Phuoc T. Ho, El Segundo, CA (US); David Wilson, Goleta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/928,343

(22) Filed: Jul. 14, 2020

(51) Int. Cl.
*H03F 3/24* (2006.01)
*H04L 27/36* (2006.01)
*H03F 1/02* (2006.01)

(52) U.S. Cl.
CPC ............ *H03F 3/24* (2013.01); *H03F 1/02* (2013.01); *H04L 27/361* (2013.01); *H04L 27/362* (2013.01)

(58) Field of Classification Search
CPC . H03F 1/02; H03F 3/24; H04L 27/361; H04L 27/362
See application file for complete search history.

(56) References Cited

U.S. PATENT DOCUMENTS

| | | | | |
|---|---|---|---|---|
| 4,954,963 A * | 9/1990 | Penz | .................. | G01S 7/292 706/25 |
| 6,215,440 B1 * | 4/2001 | Geldart | .................. | H04K 3/822 324/76.12 |
| 6,985,102 B1 | 1/2006 | Horn et al. | | |
| 8,392,149 B1 * | 3/2013 | Spencer | .................. | G06K 9/38 702/193 |
| 8,494,464 B1 * | 7/2013 | Kadambe | .................. | H04K 3/45 455/115.1 |
| 8,805,292 B1 * | 8/2014 | Carbajal | .................. | H04B 17/309 455/67.11 |
| 9,057,772 B1 * | 6/2015 | Chavez | .................. | H04B 17/27 |
| 9,692,529 B1 * | 6/2017 | Music | .................. | H04B 17/27 |
| 10,725,151 B1 * | 7/2020 | Ray | .................. | G01S 7/2926 |

(Continued)

FOREIGN PATENT DOCUMENTS

| CN | 109886116 A | 6/2019 |
|---|---|---|
| CN | 110632572 A | 12/2019 |

*Primary Examiner* — David B Lugo
(74) *Attorney, Agent, or Firm* — Burns & Levinson, LLP; Joseph M. Maraia

(57) ABSTRACT

An emitter identification system arranged to: receive a detected signal including one or more emitter signals from one or more emitters respectively where each of the emitter signals includes a unique signal characteristic related to a unique physical feature of a hardware structure associated with each of the emitters; apply a modulation signal to the detected signal to generate pulse in-phase and quadrature (IQ) data associated with the one or more emitter signals; extract one or more amplitude envelopes associated with the one or more emitter signals, where each amplitude envelope is related to the unique signal characteristic associated with each of the one or more emitters; estimate the unique signal characteristic of each of the one or more emitter signals; estimate a number of clusters related to a number of emitter signals; and identify each of the emitters by applying an unsupervised learning function.

20 Claims, 14 Drawing Sheets

(56) References Cited

U.S. PATENT DOCUMENTS

2004/0204878 A1* 10/2004 Anderson ............... G16Z 99/00
  702/66
2010/0061630 A1* 3/2010 Owechko ............. G06K 9/4642
  382/170

* cited by examiner

SYSTEMS AND METHODS FOR SPECIFIC EMITTER IDENTIFICATION

TECHNICAL FIELD

This application relates generally to electronic countermeasures systems and, more particularly, to specific emitter identification systems.

BACKGROUND

Electronic countermeasures (ECM) are utilized by most modern military land, sea, or air platforms. Aircraft are particularly capable of providing effective ECM because of their wider field of view over a geographical area or terrain. ECM can protect aircraft from being tracked by search radars, protect aircraft targeted by surface-to-air or air-to-air missiles, enable aircraft to detect and locate adversarial radars systems, or jam adversarial radar systems. Modern fighter planes typically utilize integrated detection and jamming systems or pod-based systems such as the Next Generation Jammer (NSJ).

In modern radar systems, the emitted waveform can change rapidly. Existing emitter identification systems typically use Intentional Modulation on Pulse (IMOP) detection techniques in which the systems rely on Pulse Detection Word (PDW) parameters such as frequency, pulse repetition interval (PRI), pulse width, bandwidth, and modulation type. Unfortunately, this technique is not sufficient for Specific Emitter Identification (SEI) because the estimated parameters are difficult to distinguish or de-interleave from each another due to the inseparable distribution.

In fact, identifying radar emitters using traditional waveform features by existing systems is extremely challenging or impracticable. Existing NGJ systems lack sufficient processing speed to attack rapidly changing threats. For rotating radar emitters, an emitter identification system must detect and classify the emitter during a short time interval in which the radar is pointed towards the electronic attack (EA) platform. But, the timeline for receiving and classifying a radar emitter and then cueing an NGJ can be very long. For agile radar systems that can dynamically change their radar waveform characteristics, these existing approaches are ineffective. Traditional features in agile radar systems change rapidly, creating separate clusters that belong to the same radar emitter. This multimodal distribution of features make the emitter classification by existing systems almost impossible. Current approaches also use adhoc methods of grouping features together and classifying. When the density of radar systems are closely spaced, this approach becomes ineffective. Hence, there is a need to reduce the cycle time for identification of specific radar emitters, especially in an environment where multiple agile radar emitters are active.

SUMMARY

The application, in various implementations, addresses deficiencies associated with the speed and effectiveness of existing emitter identification systems.

This application describes exemplary emitter identification systems and methods that implement Unintentional Modulation on Pulses (UMOP), which exploits the unique characteristics of each emitter transmitter. Such systems and methods, in various implementations, employ an automatic recognition algorithm that estimates, clusters, and recognizes features derived from one or more emitter signals detected by a radar receiver utilized by an ECM system. Each emitter signal includes a unique signal characteristic related to a unique physical feature of a hardware structure associated with each individual emitter.

Some of the inventive concepts described herein recognize and exploit variations in the hardware structure of electronic systems, including systems of the same type or model which, in turn, affects the electronic operations and output signal characteristics of a particular electronic system. For example, physical features such as circuit element spacing, transistor doping, circuit capacitances, wire run locations, and other structural or physical features may vary even among electronic components of the same type or model. Other systems may produce substantially similar or in-tolerance pulse trains or emitter signals while using different electronic components or architectures. Such physical structural variations result in variations in signal characteristics output that uniquely depend on each electronic component or system. Hence, each electronic radar system outputs an emitter signal having a unique signal characteristic related to a unique physical feature of a hardware structure associated with its respective emitter. The systems and methods described herein are configured to specifically identify each emitter based on their unique signal characteristics which cannot be obscured or masked by existing techniques that have proven effective against tradition IMOP techniques.

Such an emitter hardware structure may include, for example, an emitter's power amplifier (PA) configuration. In some implementations, the PA step response is characterized by the parameters of a second order dynamical system. As discussed above, each PA step response is unique regardless of whether the emitters are of the same class, type, or model. With an estimation of natural frequency and damping coefficient, the system and method herein can characterize received radar emitter pulses, determine the number of active emitters, and specifically identify each emitter, including agile emitters.

In one aspect, an emitter identification system includes a receiver arranged to receive a detected signal having one or more emitter signals from one or more emitters respectively. Each of the one or more emitter signals includes a unique signal characteristic related to a unique physical feature of a hardware structure associated with each of the one or more emitters. The system also includes a signal processor arranged to receive the detected signal from the receiver. The signal process is arranged to apply a modulation signal to the detected signal to: generate pulse in-phase and quadrature (IQ) data associated with the one or more emitter signals; extract one or more amplitude envelopes associated with the one or more emitter signals where each amplitude envelope is related to the unique signal characteristic associated with each of the one or more emitters; estimate the unique signal characteristic of each of the one or more emitter signals; estimate a number of clusters related to a number of emitter signals; and identify each of the one or more emitters by applying an unsupervised learning function.

The hardware structure may include a power amplifier. The unique signal characteristic may include a step response of the power amplifier. The signal processor may include a modulator arranged to apply the modulation signal. The modulation signal may include a continuous single tone waveform. The signal processor may include a pulse detector arranged to extract the one or more amplitude envelopes. The pulse detector may include a delayed complex multiply (DCM) circuit arranged to recover the one or more amplitude envelopes as an approximation of power amplifier step responses associated with each of the one or more emitters.

The signal processor may include an estimator arranged to determine a second order step response of power amplifiers associated with each of the one or more emitters to estimate the unique signal characteristic of each of the one or more emitter signals. The signal processor may include an emitter identifier arranged to identify each of the one or more emitters using K-means clustering and a support vector machine. The unsupervised learning function may enable a specific emitter identification (SEI) classification for each of the one or more emitters. The specific emitter identification classification may be performed in real-time or near real-time. The classification may be based on an order of a step response associated with a power amplifier of each of the one or more emitters.

In another aspect, an emitter identification signal processor includes a communications interface arranged to receive a detected signal from a receiver. The detected signal may include one or more emitter signals from one or more emitters respectively. Each of the one or more emitter signals may include a unique signal characteristic related to a unique physical feature of a hardware structure associated with each of the one or more emitters. The signal process includes a modulator arranged to apply a modulation signal to the detected signal to generate pulse in-phase and quadrature (IQ) data associated with the one or more emitter signals. The signal process also includes a pulse detector arranged to extract one or more amplitude envelopes associated with the one or more emitter signals, where each amplitude envelope is related to the unique signal characteristic associated with each of the one or more emitters. The signal processor includes an estimator arranged to estimate the unique signal characteristic of each of the one or more emitter signals. The signal processor further includes an emitter identifier arranged to estimate a number of clusters related to a number of emitter signals and identify each of the one or more emitters by applying an unsupervised learning function.

In a further aspect, a method for emitter identification includes: receiving a detected signal including one or more emitter signals from one or more emitters respectively, where each of the one or more emitter signals includes a unique signal characteristic related to a unique physical feature of a hardware structure associated with each of the one or more emitters; applying a modulation signal to the detected signal to generate pulse in-phase and quadrature (IQ) data associated with the one or more emitter signals; extracting one or more amplitude envelopes associated with the one or more emitter signals, where each amplitude envelope is related to the unique signal characteristic associated with each of the one or more emitters; estimating the unique signal characteristic of each of the one or more emitter signals; estimating a number of clusters related to a number of emitter signals; and identifying each of the one or more emitters by applying an unsupervised learning function.

Any two or more of the features described in this specification, including in this summary section, may be combined to form implementations not specifically described in this specification. Furthermore, while this specification may refer to examples of systems and methods related to radar systems or radar frequency bands, the implementations and methods herein equally apply to emitters operating in other radio frequency and/or electromagnetic frequency bands.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various aspects, addresses deficiencies associated with conventional emitter identification systems. The application includes exemplary apparatuses, systems and methods for emitter identification that implement UMOP in some configurations to exploit the unique physical and/or signal output characteristics of each emitter transmitter. Various implementations employ an automatic recognition algorithm that estimates, clusters, and recognizes features derived from one or more emitter signals detected by a radar receiver utilized by an ECM system. Each emitter signal includes a unique signal characteristic related to a unique physical feature of a hardware structure associated with each of the one or more emitters. This enables the systems and methods herein to specifically identify each emitter based on their unique signal characteristics in a way that cannot be obscured or masked by, for example, agile radar emitters.

While the systems and methods described herein include UMOP techniques applied to features extracted from the amplitude of an emitter signal for identification, clustering and recognition, other features such as phase, frequency, or amplitude responses may be examined for identification, clustering and recognition. Furthermore, one or more of these other features may be examined in combination with the features extracted from amplitude of an emitter signal to further enhance identification, clustering and recognition.

Figure 1:
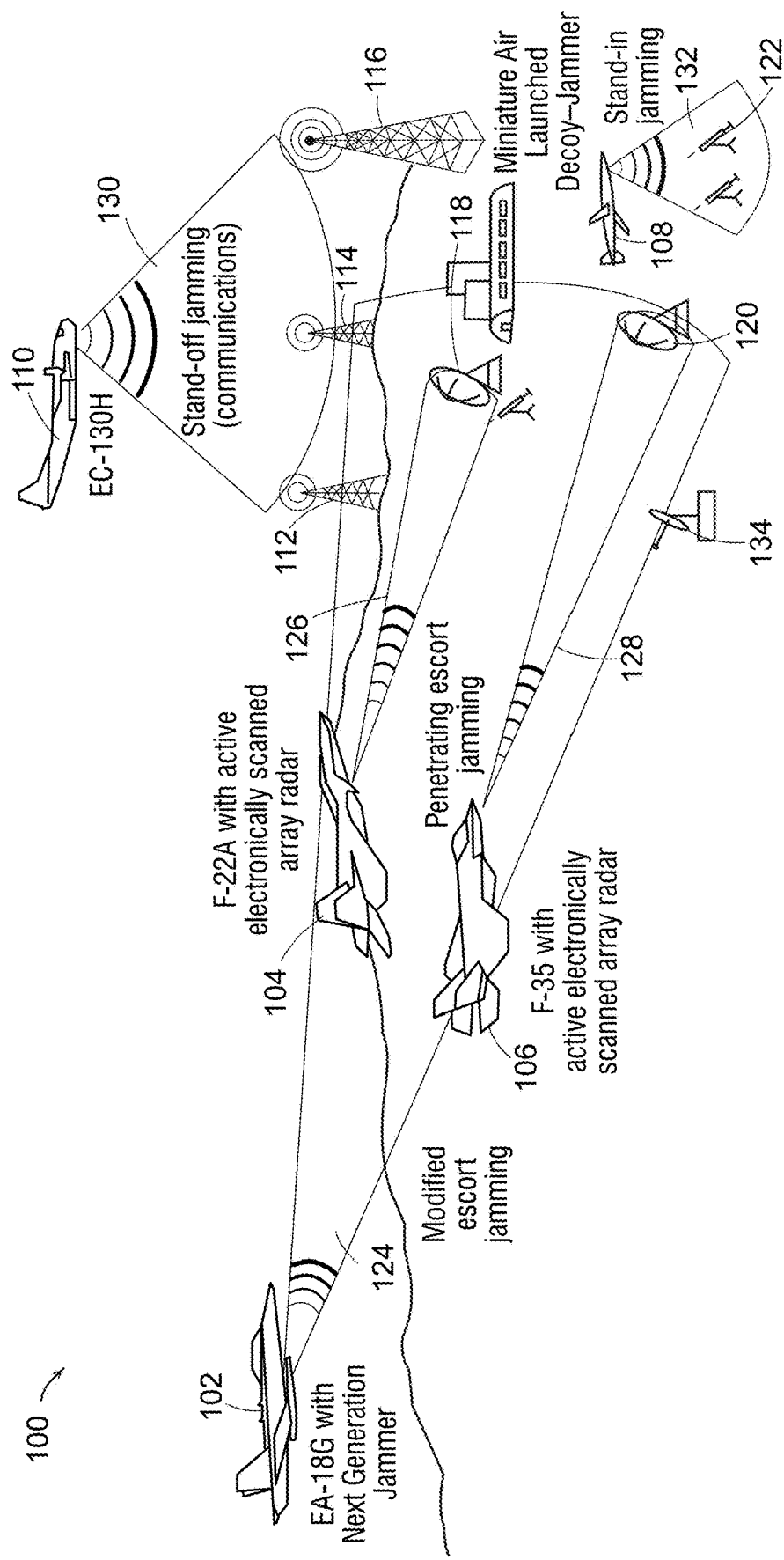
FIG. 1 is a view of a geographical terrain including various aerial vehicles using electronic countermeasures with respect to various types of radar or communications emitters.

FIG. 1 is a view of a geographical terrain 100 including various aerial vehicles 102, 104, 106, 108, and 110 using electronic countermeasures with respect to various radar emitters 118, 120, 122, 134 and communications transmitters and/or receivers 112, 114, and 116. Aerial vehicles 102, 104, 106, and 108 may include aircraft such as a fighter plane, ECM platform, and the like. Aerial vehicle 108 may include, without limitation, a drone, decoy, cruise missile, and/or an unmanned aerial vehicle (UAV). Aerial vehicle 102 may employ various types of ECM including NSJ to implement modified escort jamming via beam 124 of radar emitters 118 and 120. Aerial vehicles 104 and 106 may employ active electronically scanned array (AESA) radar to implement penetrating escort jamming via beams 126 and 128 against radar emitters 118 and 120 respectively. Aerial vehicle 110 may employ communications stand-off jamming via beam 130 against communications emitters and/or receivers 112, 114, and 116. Decoy 108 may employ stand-in jamming against emitter 122 via beam 132.

FIG. 1 illustrates the difficulty that an ECM system on an aerial vehicle such as fighter plane 104 may experience in de-interleaving and identifying a specific radar emitter such as emitter 118 among multiple active and possibly agile radar emitters such as emitters 118, 120, 122, and 134. To target emitter 118 for jamming, the ECM system of fighter plane 104 must rapidly and effectively identify emitter 118 and possibly other emitters 120, 122, and 134 to determine whether to, for example, direct jamming beam 126 toward emitter 118. The systems and methods herein provide rapid and effective techniques that enable an ECM system of, for example, fighter plane 104 to identify and target a specific emitter such as emitter 118 among multiple active emitters within a geographical terrain 100.

Figure 2:
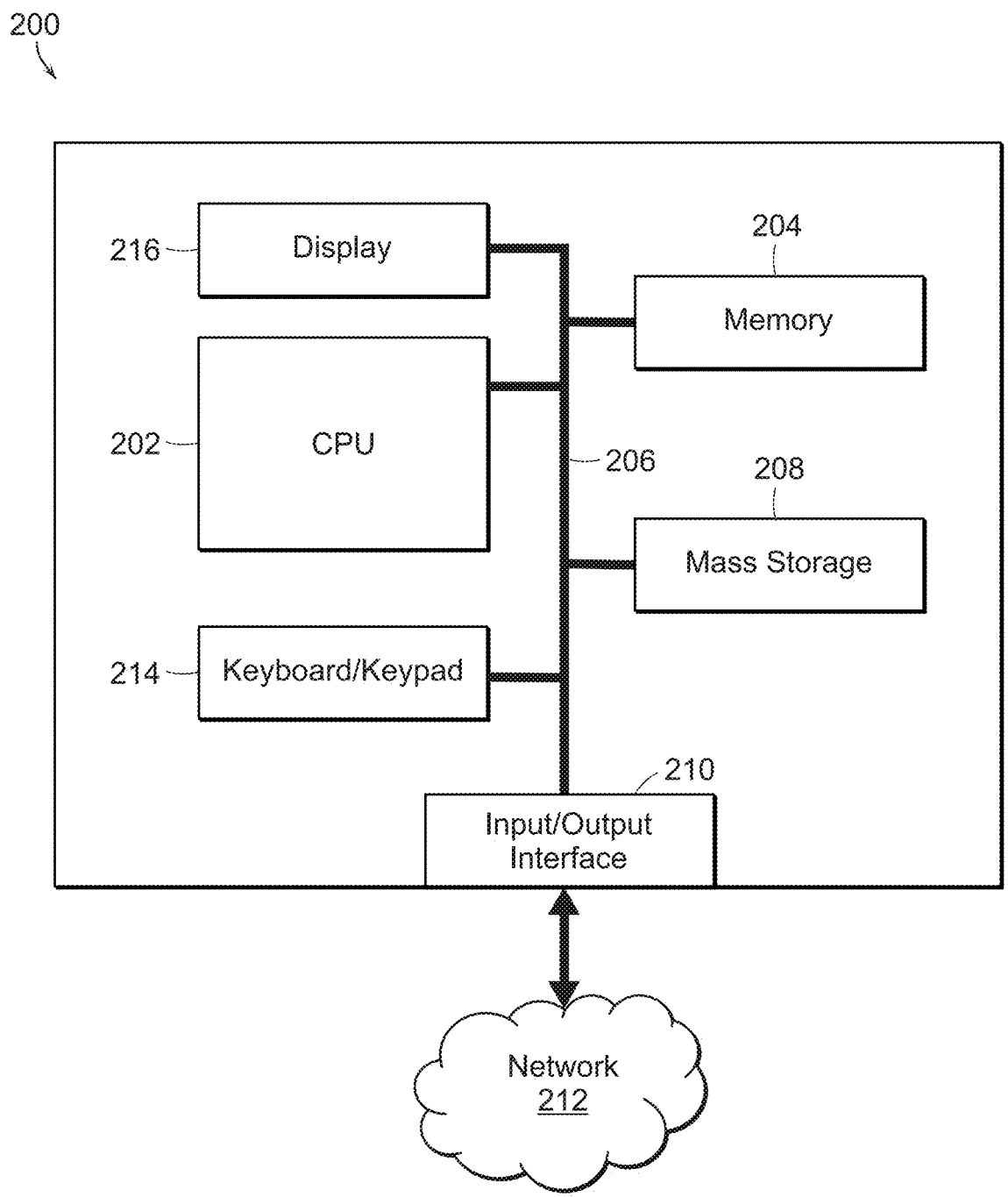
FIG. 2 is block diagram of a computer system arranged to perform processing associated with a radar emitter identification system.

FIG. 2 is block diagram of a computer system 200 arranged to perform processing associated with a radar emitter identification system such as, for example, system 300, which is discussed in detail later herein. The exemplary computer system 200 includes a central processing unit (CPU) 202, a memory 204, and an interconnect bus 206. The CPU 202 may include a single microprocessor or a plurality of microprocessors or special purpose processors for configuring computer system 200 as a multi-processor system. The memory 204 illustratively includes a main memory and a read only memory. The computer 200 also includes the mass storage device 208 having, for example, various disk drives, tape drives, etc. The memory 204 also includes dynamic random access memory (DRAM) and high-speed cache memory. In operation, memory 204 stores at least portions of instructions and data for execution by the CPU 202. The memory 204 may also contain compute elements, such as Deep In-Memory Architectures (DIMA), wherein data is sent to memory and a function of the data (e.g., matrix vector multiplication) is read out by the CPU 202.

The mass storage 208 may include one or more magnetic disk, optical disk drives, and/or solid state memories, for storing data and instructions for use by the CPU 202. At least one component of the mass storage system 208, preferably in the form of a non-volatile disk drive, solid state, or tape drive, stores the database used for processing detected signal data by the emitter identification system 300. The mass storage system 208 may also include one or more drives for various portable media, such as a floppy disk, flash drive, a compact disc read only memory (CD-ROM, DVD, CD-RW, and variants), memory stick, or an integrated circuit non-volatile memory adapter (i.e. PC-MCIA adapter) to input and output data and code to and from the computer system 200.

The computer system 200 may also include one or more input/output interfaces for communications, shown by way of example, as interface 210 and/or a transceiver for data communications via the network 212. The data interface 210 may be a modem, an Ethernet card or any other suitable data communications device. To provide the functions of a signal processor according to FIG. 3, the data interface 210 may provide a relatively high-speed link to a network 212, such as an intranet, internet, Aegis network, or the Internet, either directly or through another external interface. The communication link to the network 212 may be, for example, optical, wired, or wireless (e.g., via satellite or cellular network). The computer system 200 may also connect via the data interface 210 and network 212 to at least one other computer system to perform remote or distributed multi-sensor processing, to for a COP. Alternatively, the computer system 200 may include a mainframe or other type of host computer system capable of Web-based communications via the network 212. The computer system 200 may include software for operating a network application such as a web server and/or web client.

The computer system 200 may also include suitable input/output ports, that may interface with a portable data storage device, or use the interconnect bus 206 for interconnection with a local display 216 and keyboard 214 or the like serving as a local user interface for programming and/or data retrieval purposes. The display 216 may include a touch screen capability to enable users to interface with the system 200 by touching portions of the surface of the display 216. Server operations personnel may interact with the system 200 for controlling and/or programming the system from remote terminal devices via the network 212.

The computer system 200 may run a variety of application programs and store associated data in a database of mass storage system 208. One or more such applications may include an emitter identification system such as described with respect to FIGS. 3-13.

The components contained in the computer system 200 may enable the computer system to be used as a server, workstation, personal computer, network terminal, mobile computing device, mobile telephone, System on a Chip (SoC), and the like. As discussed above, the computer system 200 may include one or more applications such as data extraction, processing, and/or target classification using neural networks. The system 200 may include software and/or hardware that implements a web server application. The web server application may include software such as HTML, XML, WML, SGML, PHP (Hypertext Preprocessor), CGI, and like languages.

The foregoing features of the disclosure may be realized as a software component operating in the system 200 where the system 200 includes Unix workstation, a Windows workstation, a LINUX workstation, or other type of workstation. Other operation systems may be employed such as, without limitation, Windows, MAC OS, and LINUX. In some aspects, the software can optionally be implemented as a C language computer program, or a computer program written in any high level language including, without limitation, Javascript, Java, CSS, Python, Keras, TensorFlow, PHP, Ruby, C++, C, Shell, C#, Objective-C, Go, R, TeX, VimL, Perl, Scala, CoffeeScript, Emacs Lisp, Swift, Fortran, or Visual BASIC. Certain script-based programs may be employed such as XML, WML, PHP, and so on. The system 200 may use a digital signal processor (DSP).

As stated previously, the mass storage 208 may include a database. The database may be any suitable database system, including the commercially available Microsoft Access database, and can be a local or distributed database system. A database system may implement Sybase and/or a SQL Server. The database may be supported by any suitable persistent data memory, such as a hard disk drive, RAID system, tape drive system, floppy diskette, or any other suitable system. The system 200 may include a database that is integrated with the system 300, however, it will be understood that, in other implementations, the database and mass storage 208 can be an external element.

In certain implementations, the system 200 may include an Internet browser program and/or be configured operate as a web server. In some configurations, the client and/or web server may be configured to recognize and interpret various network protocols that may be used by a client or server program. Commonly used protocols include Hypertext Transfer Protocol (HTTP), File Transfer Protocol (FTP), Telnet, and Secure Sockets Layer (SSL), and Transport Layer Security (TLS), for example. However, new protocols and revisions of existing protocols may be frequently introduced. Thus, in order to support a new or revised protocol, a new revision of the server and/or client application may be continuously developed and released.

In one implementation, the system 300 includes a net-worked-based, e.g., Internet-based, application that may be configured and run on the system 200 and/or any combination of the other components of the system 300. The computer system 200 may include a web server running a Web 2.0 application or the like. Web applications running on systems 300 and/or 800 may use server-side dynamic content generation mechanisms such, without limitation, Java servlets, CGI, PHP, or ASP. In certain embodiments, mashed content may be generated by a web browser running, for example, client-side scripting including, without limitation, JavaScript and/or applets on a wireless device.

In certain implementations, system 300 and/or 200 may include applications that employ asynchronous JavaScript+XML (Ajax) and like technologies that use asynchronous loading and content presentation techniques. These techniques may include, without limitation, XHTML and CSS for style presentation, document object model (DOM) API exposed by a web browser, asynchronous data exchange of XML data, and web browser side scripting, e.g., JavaScript. Certain web-based applications and services may utilize web protocols including, without limitation, the services-orientated access protocol (SOAP) and representational state transfer (REST). REST may utilize HTTP with XML.

The system 300, computer system 200, or another component of system 300 may also provide enhanced security and data encryption. Enhanced security may include access control, biometric authentication, cryptographic authentication, message integrity checking, encryption, digital rights management services, and/or other like security services. The security may include protocols such as IPSEC and IKE. The encryption may include, without limitation, DES, 3DES, AES, RSA, ECC, and any like public key or private key based schemes.

Figure 3:
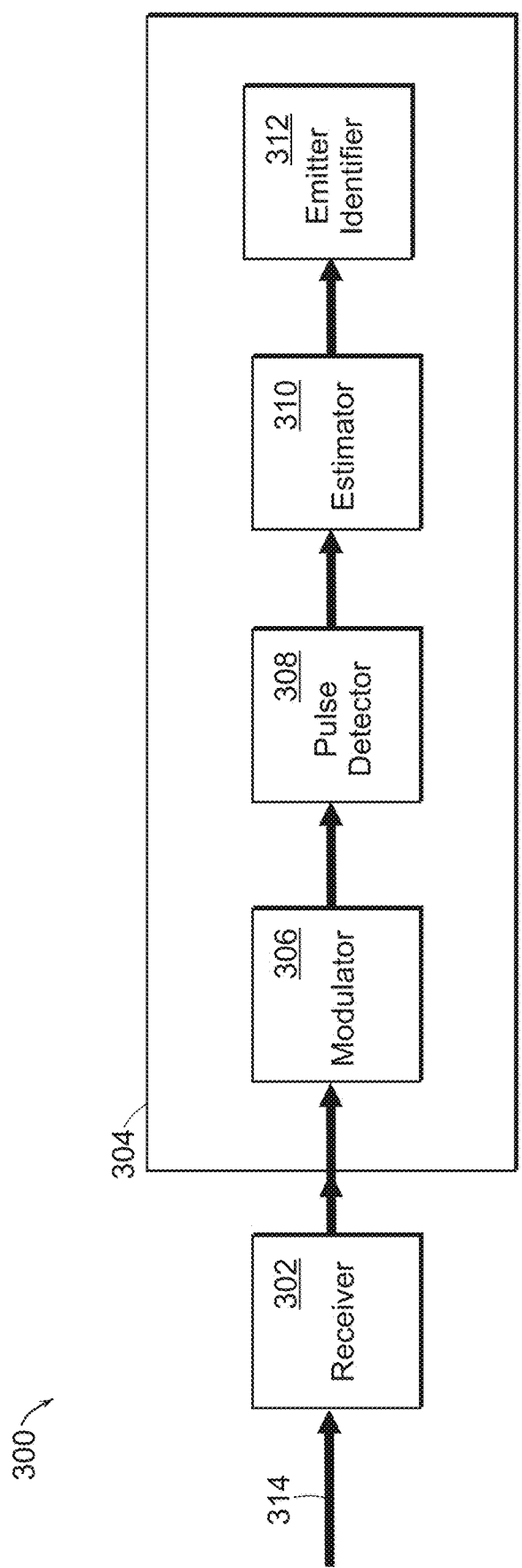
FIG. 3 is a block diagram of an exemplary specific emitter identification system.

FIG. 3 is a block diagram of an exemplary specific emitter identification (SEI) system 300 including a receiver 302 and signal processor 304. Signal processor 304 may include modulator 306, pulse detector 308, estimator 310, and emitter identifier 312. Various components, functions, and/or elements of system 300 may be implemented in hardware, software, or a combination thereof. Receiver 302 receives a detected signal 314 which may include one or more radar emitter signals from, for example, one or more of radar emitters 118, 120, 122, and 134 of FIG. 1. System 300, in various implementations, de-interleaves the various emitter signals within the detected signal 314, determines the number of emitter signals in the detected signal 314, and specifically identifies each of the radar emitters such as, for example, radar emitters 118, 120, 122, 134 and other active radar emitters whose signal is present in detected signal 314. The various components, functions, and/or elements 302-312, or a portion thereof, may be combined or integrated with each other. System 300 may interface with or be integrated with an ECM operating within, for example, an aerial vehicle 102, 104, 106, 108, and 110 of FIG. 1. System 300 may provide specific emitter identification information to an NSJ and/or AESA system.

In some configurations, system 300 implements UMOP that examines features extracted from amplitude for identification, clustering and/or recognition of radar emitters. System 300 may examine other features such as phase, frequency, or amplitude responses for identification, clustering and recognition. Furthermore, one or more of these other features may be examined in combination with the features extracted from amplitude of an emitter signal.

Figure 4:
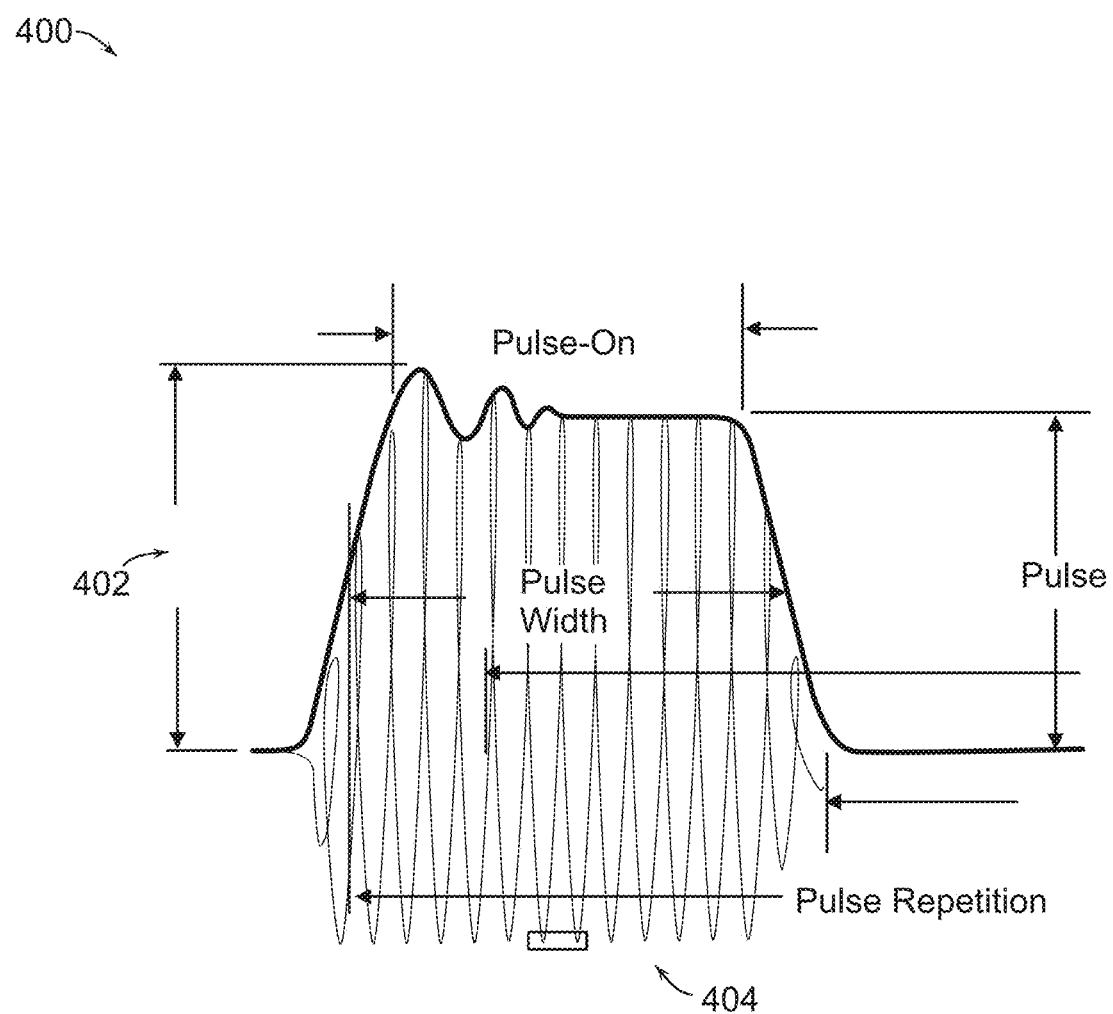
FIG. 4 is an exemplary step response of a radar power amplifier.

When the input of a continuous-time system is taken as a step signal, the corresponding output is referred to as the step response as illustrated in FIG. 4 which shows an exemplary step response 400 including amplitude 402 versus time 404 of a signal or pulse train from a radar power amplifier. Identification of continuous-time linear systems may be defined by estimating the parameters of the transfer function models obtained by means of the Laplace Transform. The step response of a radar emitter can be captured and characterized by a second order dynamical system. The two dominant features of the system transfer function may be estimated by using emitter identification system 300. Equation 1 below represents a second order differential equation that approximates the behavior of a power amplifier of, for example, radar emitter 118, 120, 122, or 134.

$$\frac{W_n^2}{S^2 + 2\varsigma W_n S + W_n^2}$$

Where: $W_n$ is the natural frequency
$\varsigma$ is the damping coefficient

Equation 1. Transfer Function for Second Order Dynamical System

Figure 5:
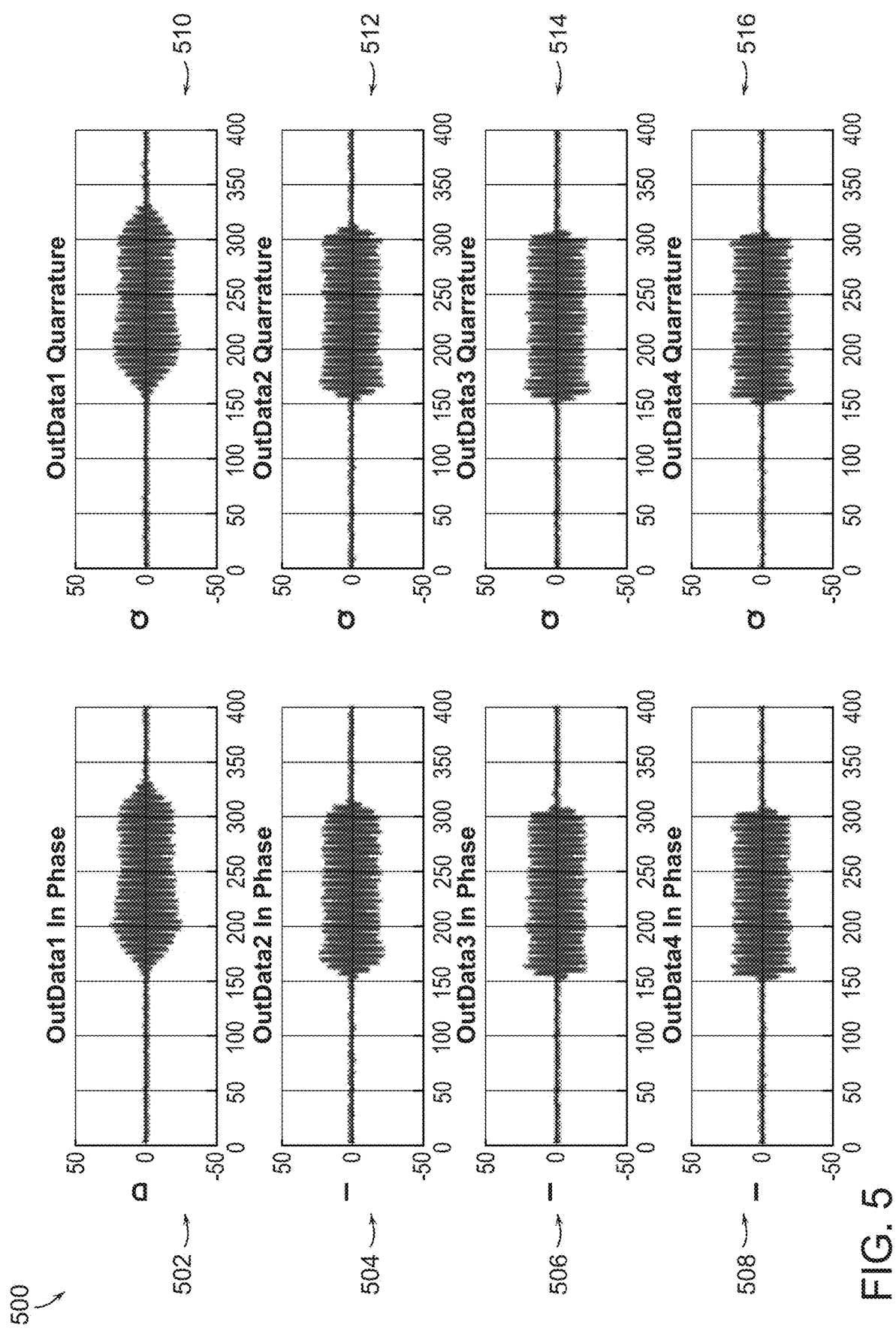
FIG. 5 shows modulated pulses associated with detected signals received from four emitters by a receiver of an emitter detection system.

Each emitter of, for example, emitters 118, 120, 122, 134 have a unique natural frequency and damping coefficient $W_n$ and $\varsigma$, respectively. Emitter identification system 300, in various implementations, estimates the two features from the received step response of each emitter and/or transmitter power amplifier modulated by the waveform. To illustrate the estimation process of system 300, In Phase and Quadrature (IQ) pulse data were simulated using four different systems corresponding to four simulated radar emitters, e.g., emitter 118, 120, 122, and 134, with unique second order responses to simulate the step response from the four PAs of the four radar emitters respectively. In some implementations, modulator 306 generates radar pulse IQ data by modulating the step responses of the emitter signals within detected signal 314 with a continuous single tone waveform. FIG. 5 shows a set 500 of modulated pulses including In-Phase signals 502, 504, 506, and 508 and Quadrature signals 510, 512, 514, and 516 associated with each emitter signal of emitters 118, 120, 122, and 134 respectively within detected signal 314 as received by receiver 302 of emitter identification system 300.

Prior to applying the system identification, pulse detector 308 extracts one or more amplitude envelopes associated with the one or more emitter signals from, for example, emitters 118, 120, 122, and 134. Each amplitude envelope is related to a unique signal characteristic associated with each of a PA of each emitter 118, 120, 122, and 134. Each amplitude envelope of the step response may be recovered using Delayed Complex Multiply (DCM) circuit 600 as an approximation of each PA step response associated with each of emitters 118, 120, 122, and 134. In one implementation, DCM circuit and/or routine 600 calculates the magnitude and phase from each IQ waveform pair 502, 510; 504, 512; 506, 514, and 508, 516, which yields a higher signal-to-noise ratio than conventional waveform processing techniques.

Figure 6:
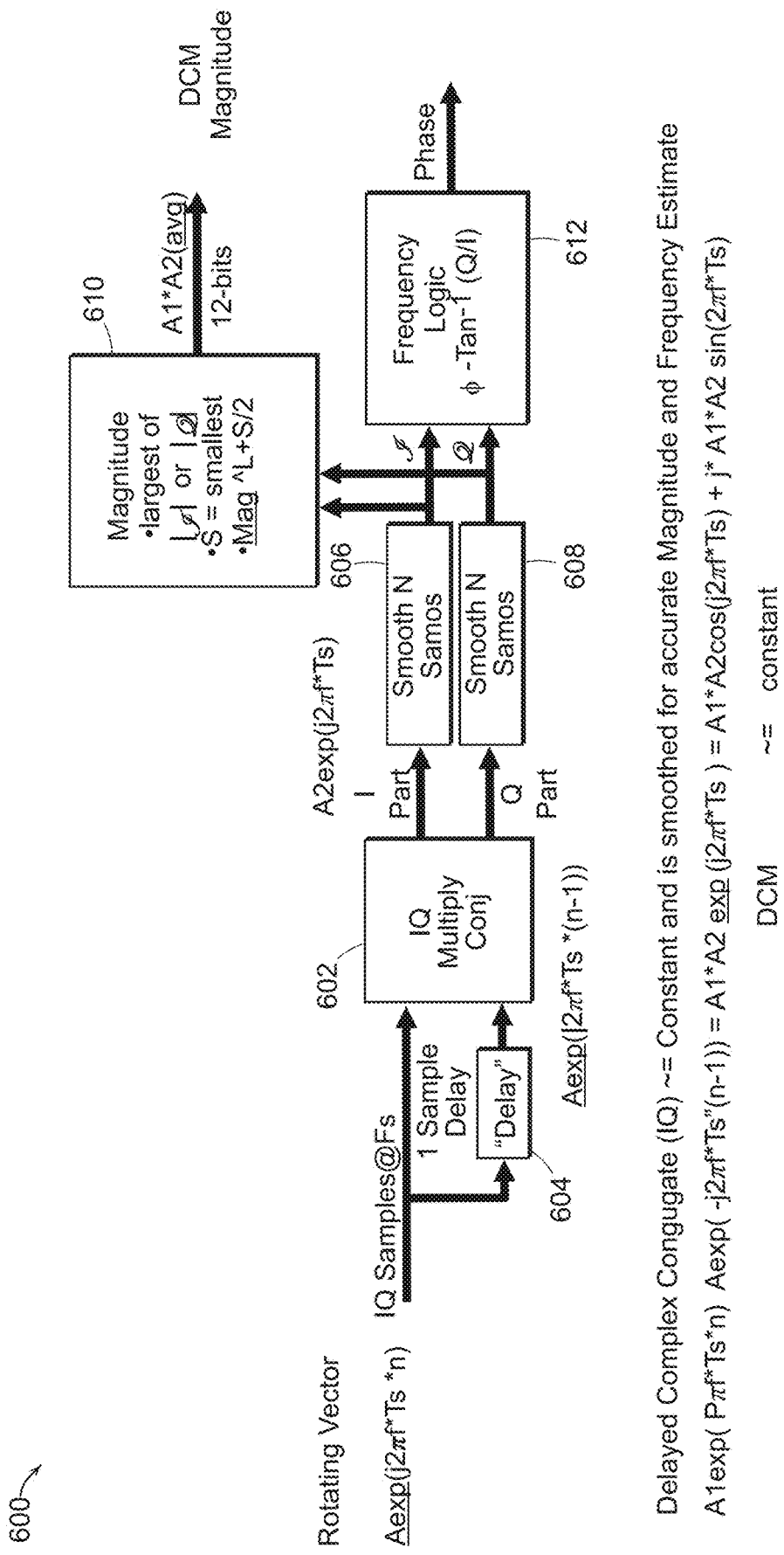
FIG. 6 is a block diagram of a delayed complex multiply (DCM) circuit used to recover an amplitude envelope associated with the detected signals of FIG. 5.

FIG. 6 is a block diagram of DCM circuit 600 used to recover one or more amplitude envelopes associated with the simulated emitter signals from, for example, emitters 118, 120, 122, and 134 in detected signal 314. DCM circuit 600 may be defined as a product of two adjacent complex IQ values in a channel of a channelizer or Fast Fourier Transform (FFT). IQ waveform pair samples, e.g., pair 502, 510, are input into IQ multiplier 602. A delay circuit 604 provides a one sample delay into multiplier 602. Multiplier 602 outputs an I-Part signal component to smoother 606 and outputs a Q-Part signal component to smoother 608 to remove and/or reduce signal noise. The signal components from smoother circuits 606 and 608 are received by magnitude circuit 610 that outputs a DCM magnitude value.

The signal components from smoother circuits 606 and 608 are also received by frequency logic circuit 612 that outputs a phase value. The product value from DCM circuit 600 yields a de-rotated vector constant in the presence of a pulse or continuous wave (CW) tone. In one implementations, frequency logic circuit 612 calculates the phase from the arctangent (I product, Q product) and magnitude circuit 610 calculates the magnitude value from the sum of I product+Q product values. In some implementations, DCM circuit 600 provides about 3 dB of processing gain over conventional envelope detection systems and algorithms. DCM circuit 600 may be implemented in hardware, software, or a combination thereof.

Figure 7:
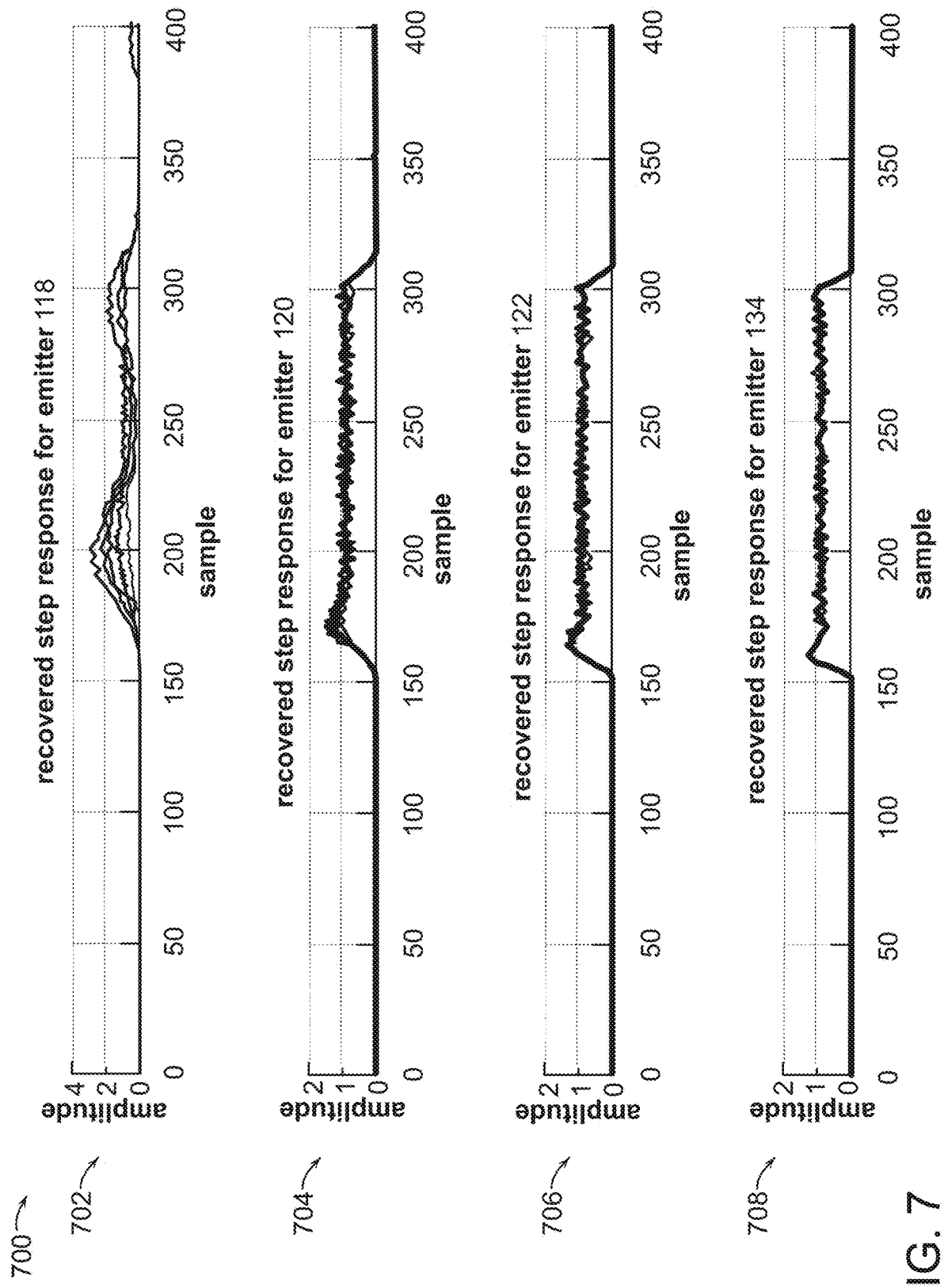
FIG. 7 shows plots of estimated step responses associated with the detected signals from the four emitters of FIG. 5.

From the modulated pulses 502, 510; 504, 512; 506, 514, and 508, 516 shown in FIG. 5, DCM circuit 600 recovers the amplitude envelope associated with each simulated emitter signal of each emitter 118, 120, 122, and 134, which is an approximation of the emitter PA step responses of each emitter 118, 120, 122, and 134. FIG. 7 shows plots 700 of estimated step responses 702, 704, 706, and 708 for fifty Monte Carlo iterations associated with detected signal 314 including the simulated emitter signals from the four emitters 118, 120, 122, and 134.

Figure 8:
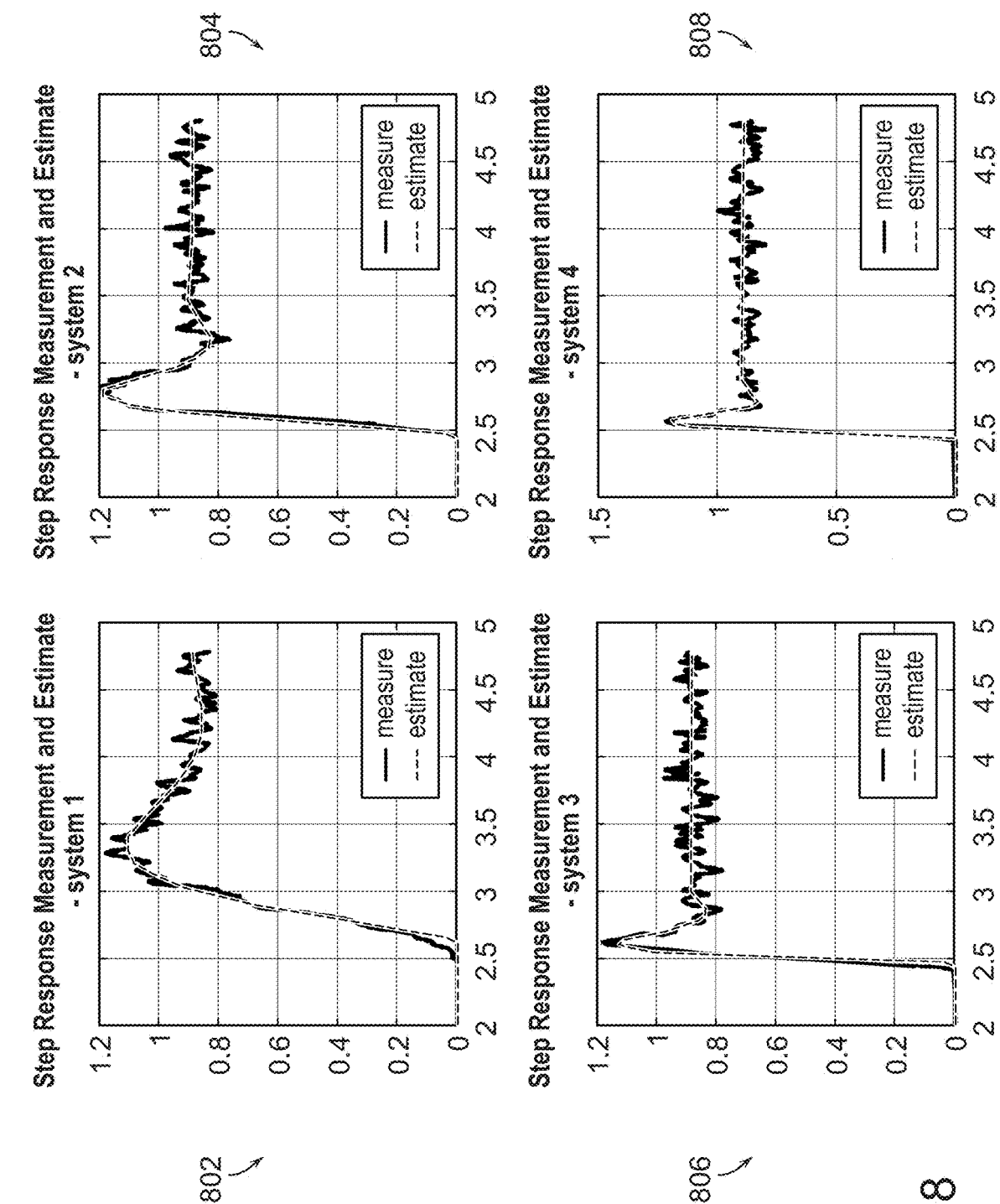
FIG. 8 shows plots of the step response measurement and estimate associated with the four emitters.

Once the step responses 702, 704, 706, and 708 are estimated by DCM circuit 600, the behavior of the second order dynamical system of the PAs for each of the emitters 118, 120, 122, and 134 can be characterized. In one implementation, estimator 310 directly calculates the natural frequency and damping coefficients associated with each step response by employing the Least Square Optimization (LSO) algorithm. Other parameters may be estimated such as rise time, transition time, and frame amplitude to create parameters for clustering. But, estimation of these parameters are typically performed indirectly and not as efficiently as utilizing the LSO technique. FIG. 8 shows plots 800 of the step response measurements and estimates 802, 804, 806, and 808 associated with the four emitters 118, 120, 122, and 134. The estimated response may be generated using the estimated parameters $W_n$ and $\varsigma$ for a second order linear system.

Figure 9:
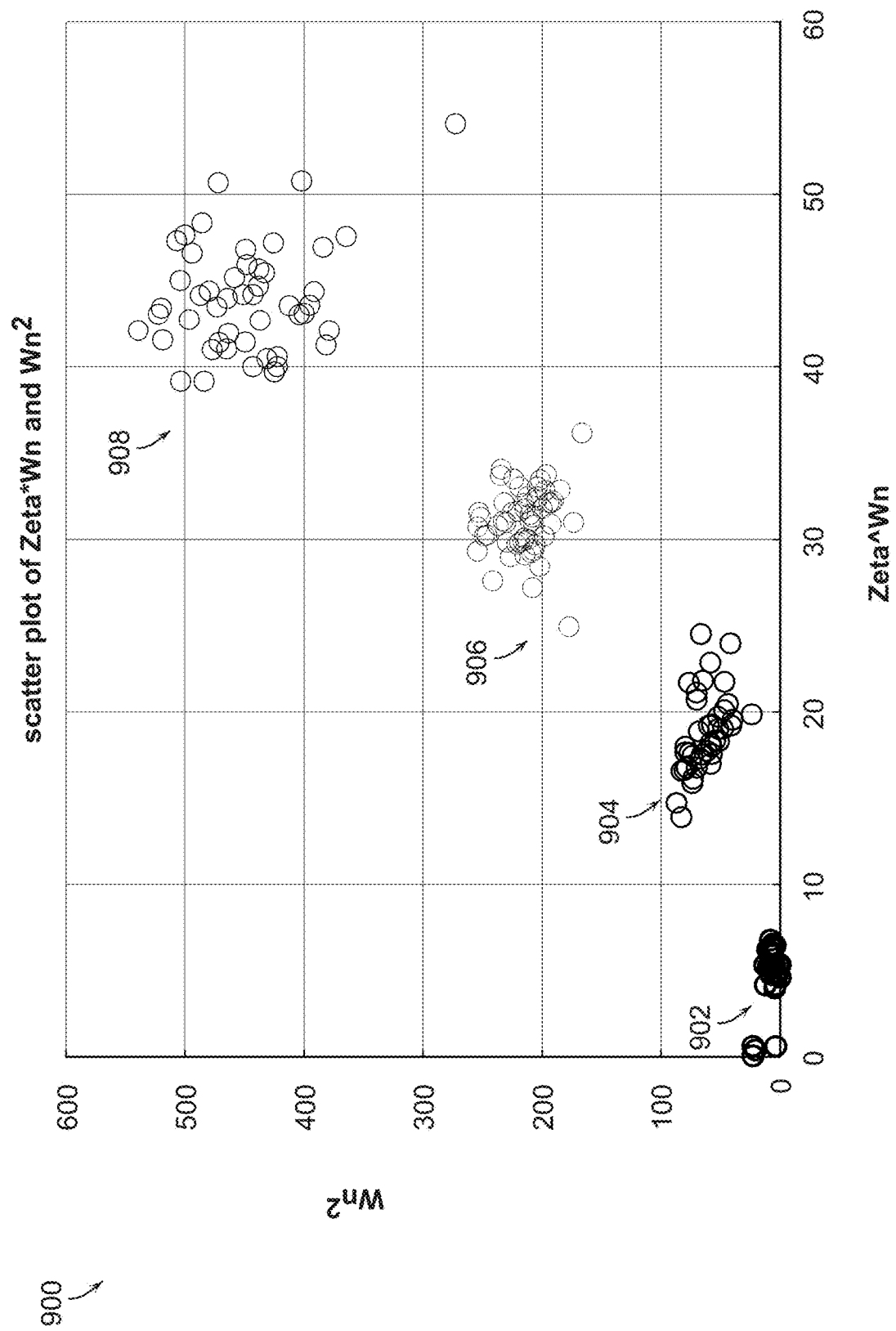
FIG. 9 is a plot of a two dimensional distribution of $\varsigma W_n$ and $W_n^2$ associated with the detected signals of FIG. 5.

FIG. 9 is a plot of a two dimensional distribution of $\varsigma W_n$ and $W_n^2$ for the 50 Monte Carlo step responses 702, 704, 706, and 708 and the step response measurements and estimates 802, 804, 806, and 808. FIG. 9 depicts the distribution of the two features $\varsigma W_n$ and $W_n^2$ jointly. As shown in FIG. 9, the four clusters 902, 904, 906, and 908, which are related to the emitter signals from emitter 118, 120, 122, and 134 respectively, are separable and can be easily clustered.

Figure 10:
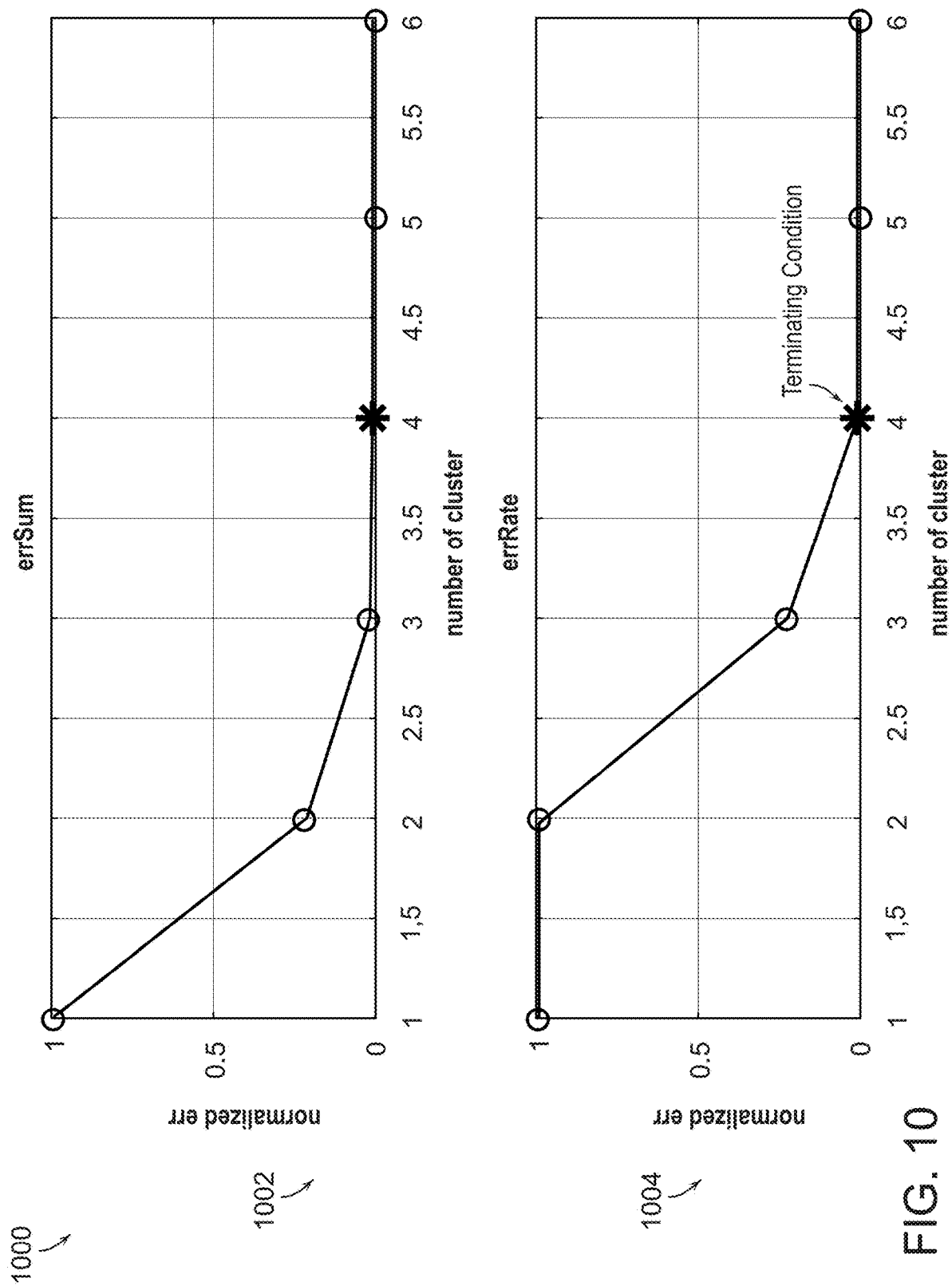
FIG. 10 shows plots of the normalized error and error rate that are used to determine when termination conditions are met to identify the number of clusters to be four.
Figure 11:
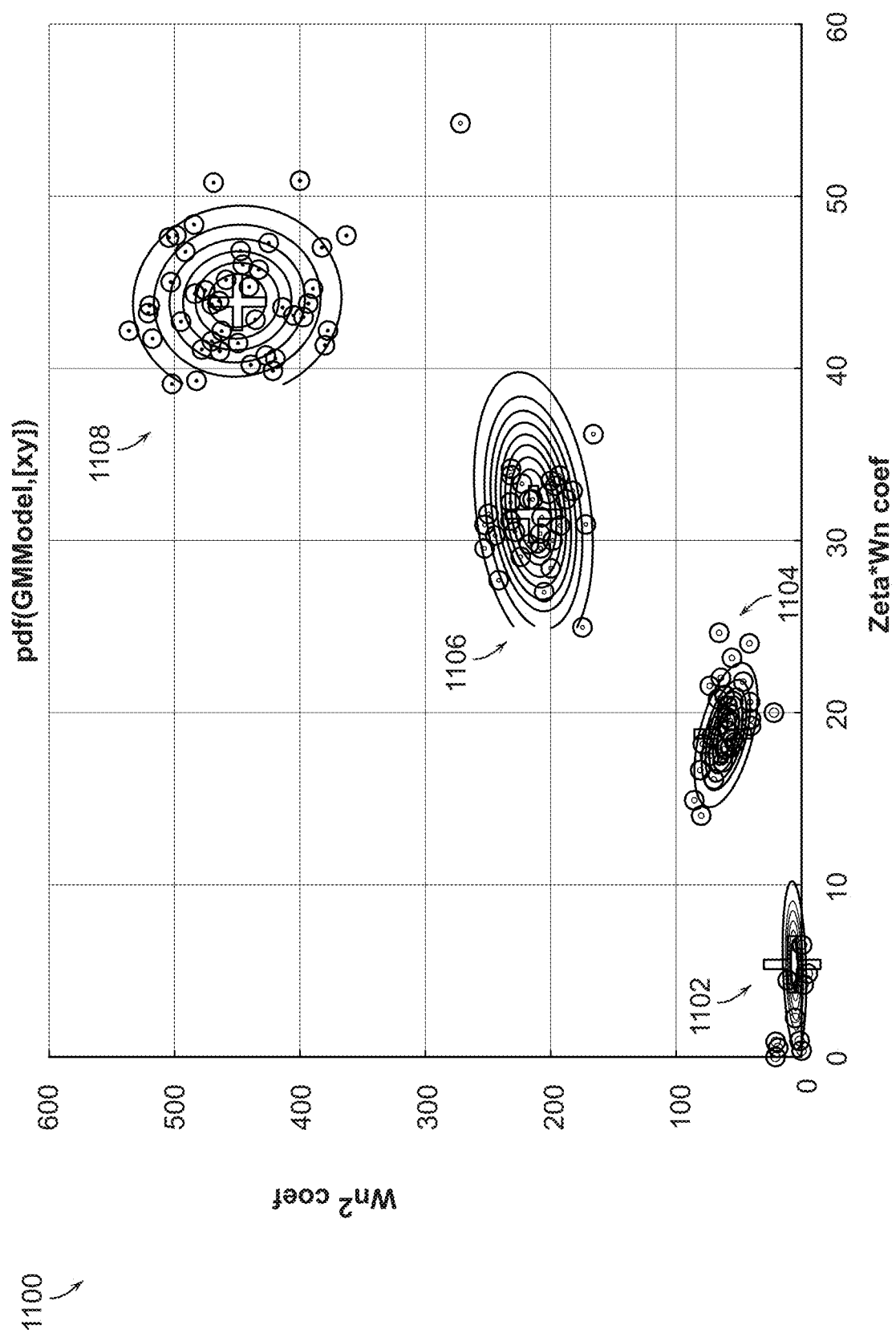
FIG. 11 is a scatter plot with the distributions grouped into the clusters identified by a K-means routine.

After estimator 310 extracts features of pulses and/or the simulated emitter signals, emitter identifier 312 estimates the number of emitters using an unsupervised learning algorithm such as, for example, a K-means function. For a number of clusters from 1 to 6, the K-means function computes the error between the clustered samples and the estimated means. The function and/or routine of emitter identifier 312 identifies the correct number of clusters when the normalized sum error is less than, for example, 0.1 and the normalized error rate is less than, for example, 0.1. FIG. 10 shows plots 1000 that depict the normalized error sum 1002 and normalized error rate 1004. When the termination conditions are met, the number of clusters are identified to be four, which corresponds to the simulated emitter signals associated with emitters 118, 120, 122, and 134. FIG. 11 is a scatter plot 1100 with the distributions grouped into the clusters 1102, 1104, 1106, and 1108 identified by a K-means functions and/or routine of emitter identifier 312. Plot 1100 also depicts contours for each cluster 1102, 1104, 1106, and 1108 generated by the Gaussian Mixture Model.

Figure 12:
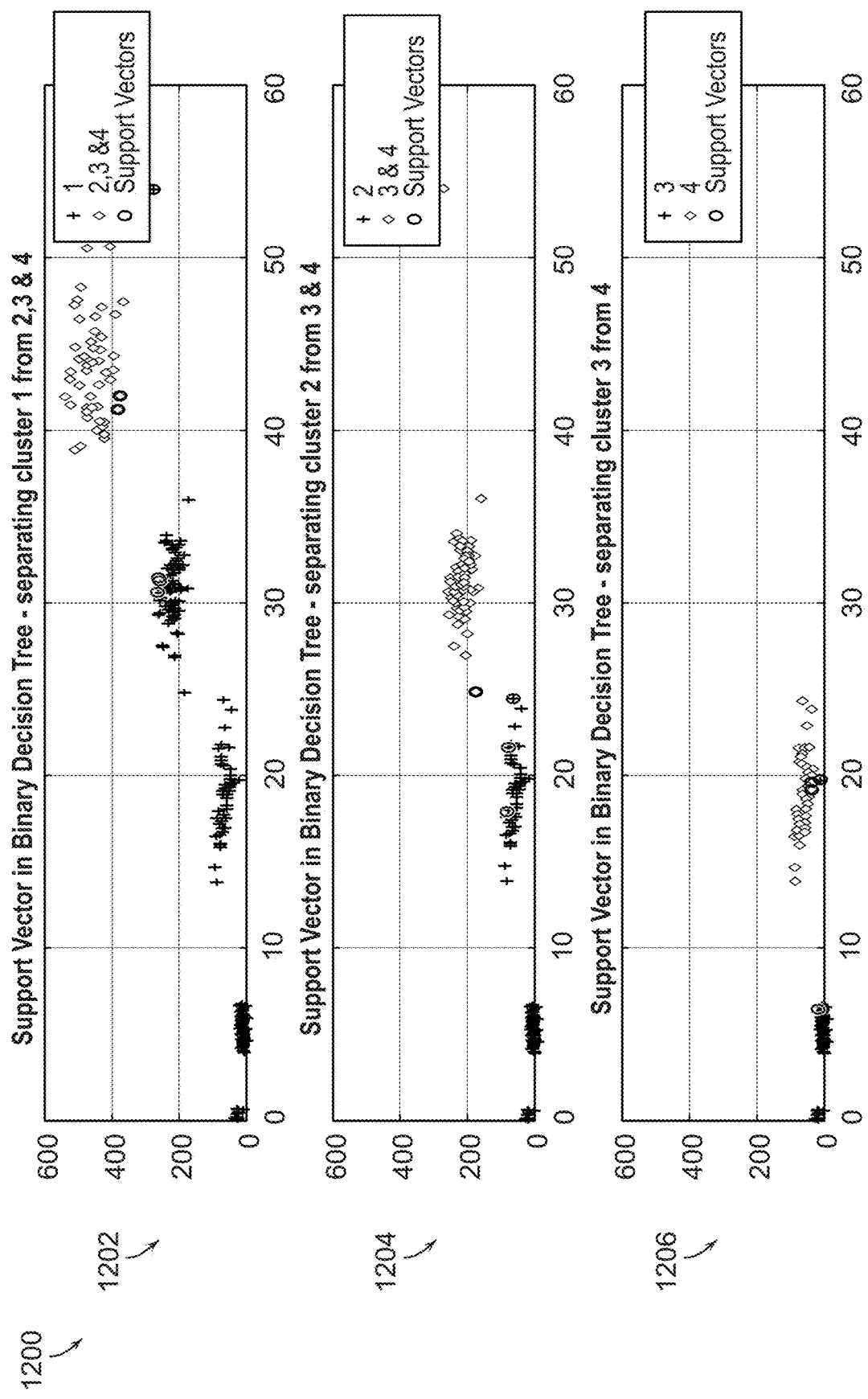
FIG. 12 shows plots illustrating how supervised learning operates in an iterative binary tree pruning procedure.
Figure 13:
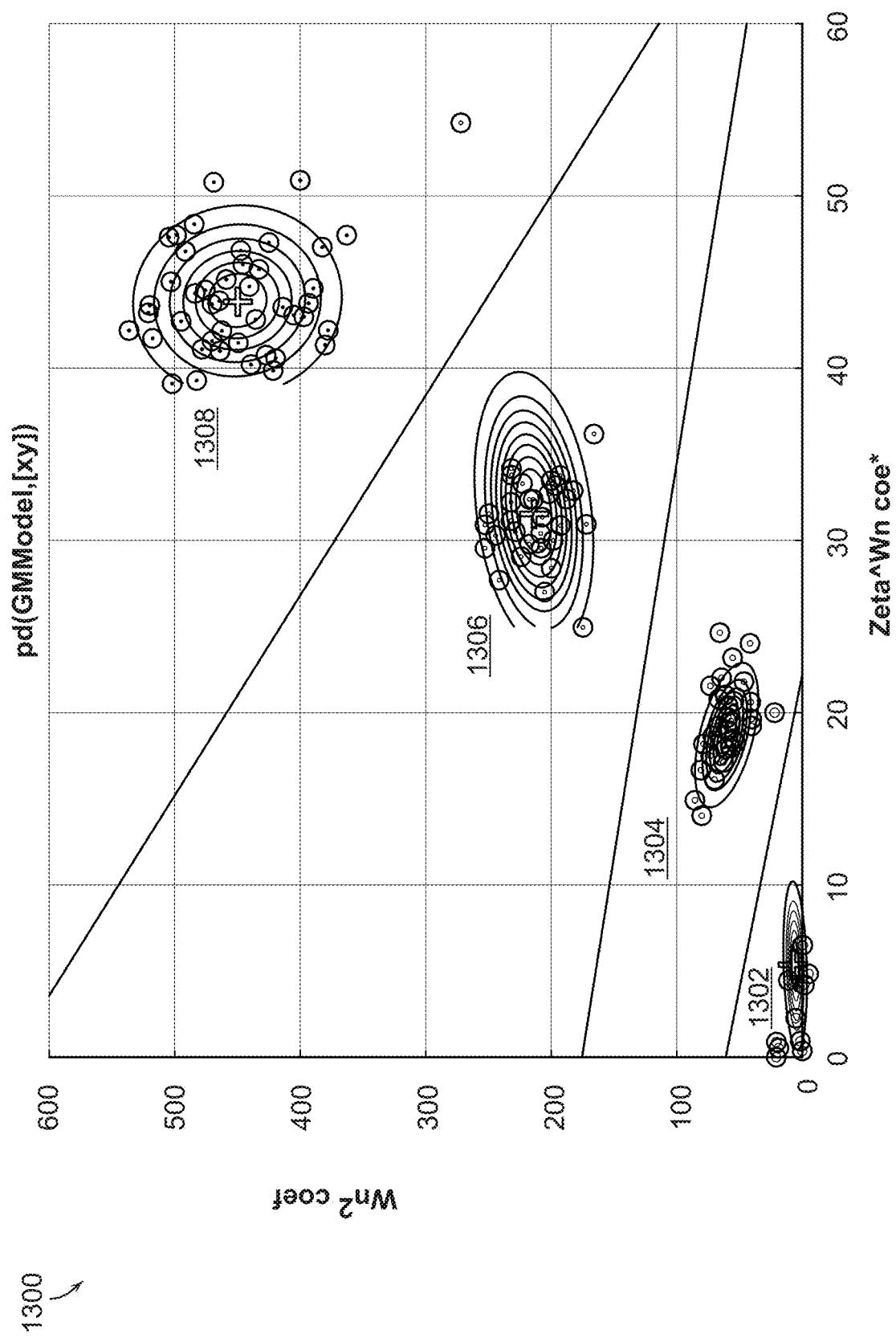
FIG. 13 is a plot of the region of separation of the four clusters.

After the features are identified and clustered, emitter identifier 312 uses the emitter signal samples to train a recognition algorithm. In a supervised learning phase, emitter identifier 312 uses the samples identified for each cluster to compute the discriminate line that separates the clusters, e.g., clusters 1102, 1104, 1106, and 1108, using a Support Vector Machine (SVM) algorithm. In one implementations, the SVM algorithm computes the discriminator that separates two classes of distribution where the margin of error is the largest. For multiple class recognition, emitter identifier 312 invokes the SVM algorithm iteratively such that one cluster is pruned from the rest. The procedure repeats until the last two clusters are separated from each other. FIG. 12 shows plots 1200 illustrating how supervised learning operates in an iterative binary tree pruning procedure. For example, plot 1202 shows cluster 1 being separated from clusters 2, 3 and 4. Then, plot 1204 shows cluster 2 being separated from clusters 3 and 4. Lastly, plot 1206 shows cluster 3 being separated from cluster 4. With the supporting vector computed, emitter identifier 312 is able to recognize emitter pulses and their associated emitters in real-time or near real-time. FIG. 13 is a plot 1300 showing four regions of separation 1302, 1304, 1306, and 1308 associated with the identified the four clusters 1102, 1104, 1106, and 1108 that correspond to the identified emitters 118, 120, 122, and 134.

Figure 14:
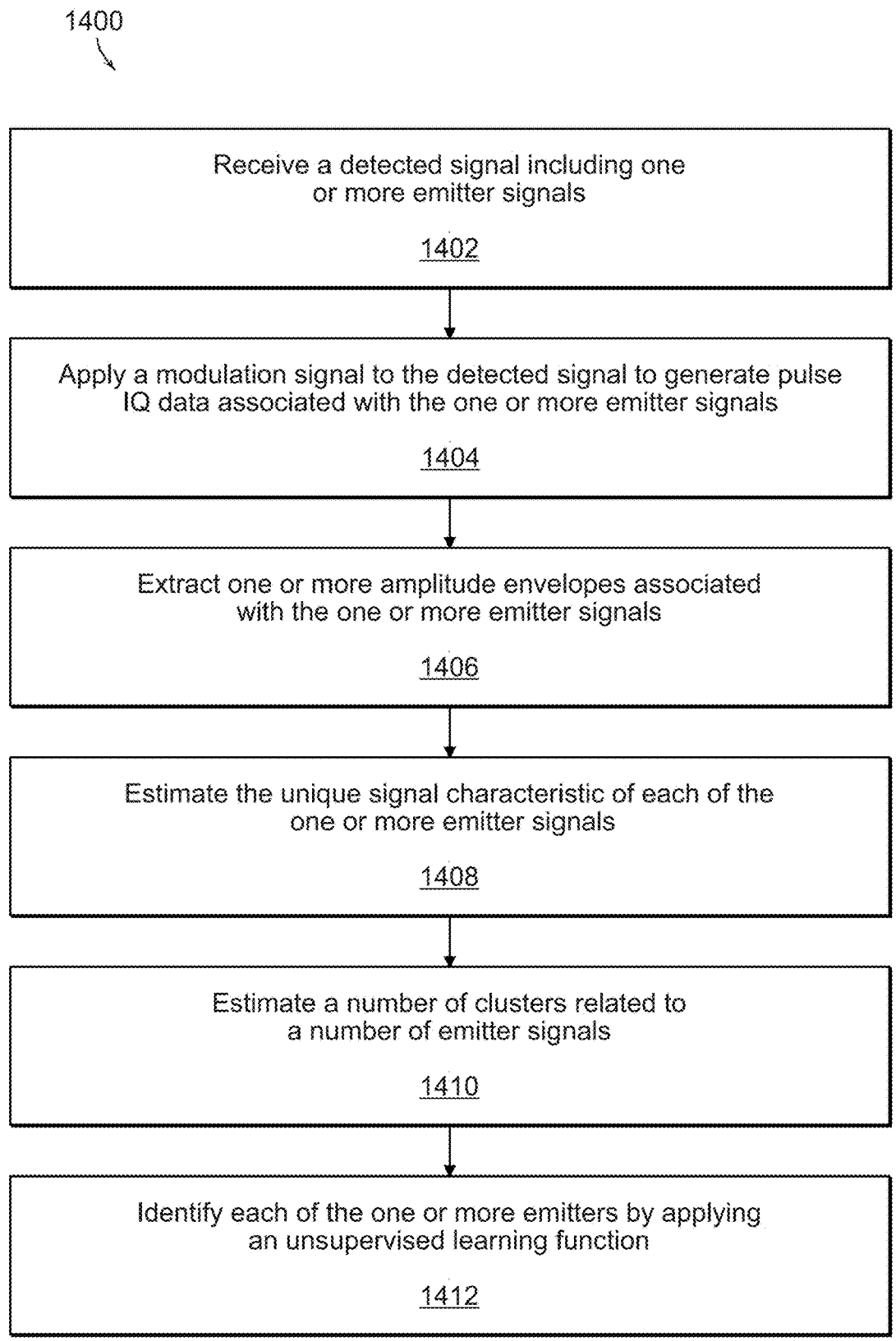
FIG. 14 is an exemplary process for performing specific emitter identification.

FIG. 14 is an exemplary process 1400 for performing specific emitter identification. Process 1400 includes: receiving a detected signal including one or more emitter signals from one or more emitters respectively, where each of the one or more emitter signals includes a unique signal characteristic related to a unique physical feature of a hardware structure associated with each of the one or more emitters (Step 1402); applying a modulation signal to the detected signal to generate pulse in-phase and quadrature (IQ) data associated with the one or more emitter signals (Step 1404); extracting one or more amplitude envelopes associated with the one or more emitter signals, where each amplitude envelope is related to the unique signal characteristic associated with each of the one or more emitters (Step 1406); estimating the unique signal characteristic of each of the one or more emitter signals (Step 1408); estimating a number of clusters related to a number of emitter signals; and identifying each of the one or more emitters by applying an unsupervised learning function (Step 1410).

It will be apparent to those of ordinary skill in the art that certain aspects involved in the operation of the system 300, signal processor 302, or other devices may be embodied in a computer program product that includes a computer usable and/or readable medium. For example, such a computer usable medium may consist of a read only memory device, such as a CD ROM disk or conventional ROM devices, or a random access memory, such as a hard drive device or a computer diskette, or flash memory device having a computer readable program code stored thereon.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. An emitter identification system comprising:
   a receiver arranged to receive a detected signal including one or more emitter signals from one or more emitters respectively, wherein each of the one or more emitter signals includes a unique signal characteristic related to a unique physical feature of a hardware structure associated with each of the one or more emitters;
   a signal processor arranged to receive the detected signal from the receiver and configured to:
   apply a modulation signal to the detected signal to generate pulse in-phase and quadrature (IQ) data associated with the one or more emitter signals;
   extract one or more amplitude envelopes associated with the one or more emitter signals, wherein each amplitude envelope is related to the unique signal characteristic associated with each of the one or more emitters;
   estimate the unique signal characteristic of each of the one or more emitter signals;
   estimate a number of clusters related to a number of emitter signals; and
   identify each of the one or more emitters by applying an unsupervised learning function.

2. The system of claim 1, wherein the hardware structure includes a power amplifier and the unique signal characteristic includes a step response of the power amplifier.

3. The system of claim 1, wherein the signal processor includes a modulator arranged to apply the modulation signal, wherein the modulation signal includes a continuous single tone waveform.

4. The system of claim 1, wherein the signal processor includes a pulse detector arranged to extract the one or more amplitude envelopes.

5. The system of claim 4, wherein the pulse detector includes a delayed complex multiply (DCM) circuit arranged to recover the one or more amplitude envelopes as an approximation of power amplifier step responses associated with each of the one or more emitters.

6. The system of claim 1, wherein the signal processor includes an estimator arranged to determine a second order step response of power amplifiers associated with each of the one or more emitters to estimate the unique signal characteristic of each of the one or more emitter signals.

7. The system of claim 1, wherein the signal processor includes an emitter identifier arranged to identify each of the one or more emitters using K-means clustering and a support vector machine.

8. The system of claim 7, wherein the unsupervised learning function enables a specific emitter identification (SEI) classification for each of the one or more emitters.

9. The system of claim 8, wherein the specific emitter identification classification is performed in one of real-time and near real-time.

10. The system of claim 9, wherein the classification is based on an order of a step response associated with a power amplifier of each of the one or more emitters.

11. An emitter identification signal processor comprising:
    a communications interface arranged to receive a detected signal from a receiver, the detected signal including one or more emitter signals from one or more emitters respectively, wherein each of the one or more emitter signals includes a unique signal characteristic related to a unique physical feature of a hardware structure associated with each of the one or more emitters;
    a modulator arranged to apply a modulation signal to the detected signal to generate pulse in-phase and quadrature (IQ) data associated with the one or more emitter signals;
    a pulse detector arranged to extract one or more amplitude envelopes associated with the one or more emitter signals, wherein each amplitude envelope is related to the unique signal characteristic associated with each of the one or more emitters;
    an estimator arranged to estimate the unique signal characteristic of each of the one or more emitter signals; and
    an emitter identifier arranged to estimate a number of clusters related to a number of emitter signals and identify each of the one or more emitters by applying an unsupervised learning function.

12. The signal processor of claim 11, wherein the hardware structure includes a power amplifier and the unique signal characteristic includes a step response of the power amplifier.

13. The signal processor of claim 11, wherein the modulation signal includes a continuous single tone waveform.

14. The signal processor of claim 11, wherein the pulse detector includes a delayed complex multiply (DCM) circuit arranged to recover the one or more amplitude envelopes as an approximation of power amplifier step responses associated with each of the one or more emitters.

15. The signal processor of claim 11, wherein the estimator is arranged to determine a second order step response of power amplifiers associated with each of the one or more emitters to estimate the unique signal characteristic of each of the one or more emitter signals.

16. The signal processor of claim 11, wherein the emitter identifier is arranged to identify each of the one or more emitters using K-means clustering and a support vector machine.

17. The signal processor of claim 16, wherein the unsupervised learning function enables a specific emitter identification (SEI) classification for each of the one or more emitters.

18. The signal processor of claim 17, wherein the specific emitter identification classification is performed in one of real-time and near real-time.

19. The signal processor claim 18, wherein the classification is based on an order of a step response associated with a power amplifier of each of the one or more emitters.

20. A method for emitter identification comprising:
receiving a detected signal including one or more emitter signals from one or more emitters respectively, wherein each of the one or more emitter signals includes a unique signal characteristic related to a unique physical feature of a hardware structure associated with each of the one or more emitters;
applying a modulation signal to the detected signal to generate pulse in-phase and quadrature (IQ) data associated with the one or more emitter signals;
extracting one or more amplitude envelopes associated with the one or more emitter signals, wherein each amplitude envelope is related to the unique signal characteristic associated with each of the one or more emitters;
estimating the unique signal characteristic of each of the one or more emitter signals;
estimating a number of clusters related to a number of emitter signals; and
identifying each of the one or more emitters by applying an unsupervised learning function.

* * * * *